(12) United States Patent
Song

(10) Patent No.: US 11,864,343 B2
(45) Date of Patent: Jan. 2, 2024

(54) HEAT DISSIPATION FAN

(71) Applicant: Lenovo (Beijing) Limited, Beijing (CN)

(72) Inventor: Rui Song, Beijing (CN)

(73) Assignee: LENOVO (BEIJING) LIMITED, Beijing (CN)

(*) Notice: Subject to any disclaimer, the term of this patent is extended or adjusted under 35 U.S.C. 154(b) by 0 days.

(21) Appl. No.: 18/175,070

(22) Filed: Feb. 27, 2023

(65) Prior Publication Data

US 2023/0276597 A1  Aug. 31, 2023

(30) Foreign Application Priority Data

Feb. 28, 2022 (CN) .......................... 202210206165.9

(51) Int. Cl.
| | |
|---|---|
| *F04D 29/30* | (2006.01) |
| *H05K 7/20* | (2006.01) |
| *F04D 29/32* | (2006.01) |
| *F04D 29/54* | (2006.01) |
| *G06F 1/20* | (2006.01) |

(52) U.S. Cl.
CPC ....... *H05K 7/20172* (2013.01); *F04D 29/325* (2013.01); *F04D 29/541* (2013.01); *G06F 1/203* (2013.01)

(58) Field of Classification Search
CPC ...... F04D 29/30; F04D 29/281; F04D 29/282; F04D 29/329; F04D 29/325; H05K 7/20172; H05K 7/20154; G06F 1/203
See application file for complete search history.

(56) References Cited

U.S. PATENT DOCUMENTS

| | | | |
|---|---|---|---|
| 2021/0062820 A1* | 3/2021 | Lin | .......................... F04D 29/30 |
| 2021/0215170 A1* | 7/2021 | Chen | .................... F04D 29/4226 |
| 2021/0317844 A1* | 10/2021 | Chen | ..................... F04D 29/281 |
| 2021/0321533 A1* | 10/2021 | Chen | ..................... F04D 29/281 |

* cited by examiner

*Primary Examiner* — J. Todd Newton
*Assistant Examiner* — Maxime M Adjagbe
(74) *Attorney, Agent, or Firm* — Anova Law Group, PLLC

(57) ABSTRACT

A heat dissipation fan includes: a body including a fan air inlet surface, a central shaft driving surface located inside the fan air inlet surface, and a plurality of protrusion structures configured at spacings in a circumference direction of the central shaft driving surface; and fan blades including first fan blades connected between the central shaft driving surface and the fan air inlet surface, and second fan blades connected between the protrusion structure and the fan air inlet surface. A fan air inlet angle is formed between each fan blade and the central shaft driving surface, and the plurality of protrusion structures are configured to vary the fan air inlet angle to control a flow field of an airflow entering the fan air inlet angle.

10 Claims, 4 Drawing Sheets

HEAT DISSIPATION FAN

CROSS-REFERENCE TO RELATED APPLICATION

This application claims priority to Chinese Patent Application No. 202210206165.9, filed on Feb. 28, 2022, the entire content of which is incorporated herein by reference.

TECHNICAL FIELD

The present disclosure relates to the technical field of notebook computer technologies and, more particularly, to a heat dissipation fan for a notebook computer.

BACKGROUND

For a notebook computer, performance of a heat dissipation fan determines the performance of the notebook computer itself. The heat dissipation fan is a primary source of noises generated from the notebook computer. Thus, a design of fan blades needs to be optimized to improve the heat dissipation performance and to reduce fan noise.

Often, the fan blades are designed to have unequal spacing to solve the above-described problem. Through the unequal spacing design of the fan blades, a sharpness or tone of an original same frequency band sound generated as the heat dissipation fan rotates is scrambled, thereby reducing a howling sound and improving the noise performance. However, the unequal spacing design of the fan blades in the prior art has issues such as a reduced flow rate and a reduced air pressure due to uneven air intake caused by varying fan inlet angles.

SUMMARY

One aspect of the present disclosure provides a heat dissipation fan. The heat dissipation fan includes: a body including a fan air inlet surface, a central shaft driving surface located inside the fan air inlet surface, and a plurality of protrusion structures configured at spacings in a circumference direction of the central shaft driving surface; and fan blades including first fan blades connected between the central shaft driving surface and the fan air inlet surface, and second fan blades connected between the protrusion structure and the fan air inlet surface. A fan air inlet angle is formed between each fan blade and the central shaft driving surface, and the plurality of protrusion structures are configured to vary the fan air inlet angle to control a flow field of an airflow entering the fan air inlet angle.

Another aspect of the present disclosure provides a method of determining a position of a fan blade in a heat dissipation fan. The heat dissipation fan includes a body including a fan air inlet surface, a central shaft driving surface located inside the fan air inlet surface, and a plurality of protrusion structures configured at spacings in a circumference direction of the central shaft driving surface, and fan blades including first fan blades connected between the central shaft driving surface and the fan air inlet surface, and second fan blades connected between the protrusion structure and the fan air inlet surface. The method includes: determining a first fan air inlet angle and a quantity of the plurality of protrusion structures, the first fan air inlet angle formed between each first fan blade and the central shaft driving surface being identical for all the first fan blades; identifying the first fan air inlet angle to be a second fan air inlet angle corresponding to an initial second fan blade, the initial second fan blade being adjacent to one of the first fan blades; determining a third fan air inlet angle corresponding to each second fan blade based on a connection sequence of the second fan blades on each of the plurality of protrusion structures, the second fan air inlet angle, and the quantity of the plurality of protrusion structures, the third fan air inlet angle varying for different second fan blades; and determining the position of each first fan blade based on the first fan air inlet angle and the position of each second fan blade based on the third fan air inlet angle.

BRIEF DESCRIPTION OF THE DRAWINGS

To more clearly illustrate the technical solution of the present disclosure, the accompanying drawings used in the description of the disclosed embodiments are briefly described below. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Figure 1:
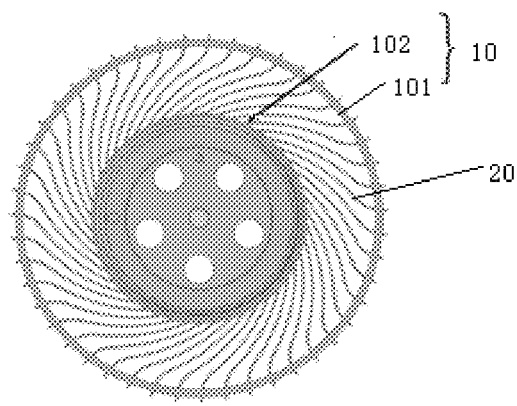
FIG. 1 is a schematic structural diagram of an existing heat dissipation fan.

In order to make the objectives, technical solutions, and advantages of the present disclosure clearer, the present disclosure will be further described in detail below with reference to the accompanying drawings. Obviously, the described embodiments are only some of the embodiments of the present disclosure, not all of the embodiments. Based on the embodiments of the present disclosure, all other embodiments obtained by those of ordinary skill in the art without creative efforts shall fall within the scope of the present disclosure. In the specification and drawings, same or similar reference numerals refer to same or similar parts or components. For the sake of clarity, the drawings are not necessarily drawn to scale, and some well-known components and structures may be omitted from the drawings.

FIG. 1 is a schematic structural diagram of an existing heat dissipation fan.

As shown in FIG. 1, the existing heat dissipation fan includes a body 10 and fan blades 20. The body 10 includes a fan air inlet surface 101 and a central shaft driving surface 102 located inside the fan air inlet surface 101. The fan blades 20 are connected between the central shaft driving surface 102 and the fan air inlet surface 101. The fan blades 20 connected between the central shaft driving surface 102 and the fan air inlet surface 101 are arranged at unequal spacings (or unequal intervals). An air inlet angle is formed between the fan blades 20 and the central shaft driving surface 102 for taking in an airflow. The unequal spacing arrangement of the plurality of fan blades in the existing heat dissipation fan scrambles a sharpness (or a tone) of an original same frequency band sound generated as the existing heat dissipation fan rotates, thereby reducing a howling sound and improving noise performance. However, the unequal spacing arrangement of the fan blades in the existing heat dissipation fan has issues such as a reduced flow rate and a reduced air pressure due to uneven air intake caused by varying fan air inlet angles.

Figure 2:
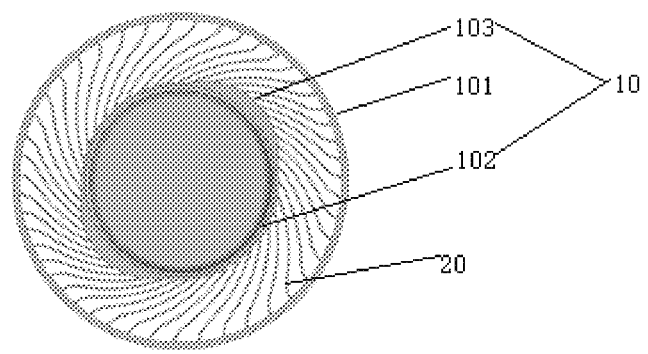
FIG. 2 is a schematic structural diagram of an exemplary heat dissipation fan according to some embodiments of the present disclosure.

FIG. 2 is a schematic structural diagram of an exemplary heat dissipation fan according to some embodiments of the present disclosure.

As shown in FIG. 2, the heat dissipation fan includes a body 10 and fan blades 20. The body 10 includes a fan air inlet surface 101 and a central shaft driving surface 102 located inside the fan air inlet surface 101. A plurality of protrusion structures 103 are arranged at spacings in a circumferential direction of the central shaft driving surface 102. Some fan blades 20 are connected between the central shaft driving surface 102 and the fan air inlet surface 101. Some other fan blades 20 are connected between each of the plurality of protrusion structures 103 and the fan air inlet surface 101. An air inlet angle is formed between the fan blades 20 and the central shaft driving surface 102 for taking in an airflow. The plurality of protrusion structures 103 are used to vary the fan air inlet angle to control a flow field of the airflow entering the fan air inlet angle.

For example, the central shaft driving surface is a hub surface. The central shaft driving surface is driven by a central shaft to rotate the fan blades, thereby dissipating heat from the notebook computer.

In some embodiments, when the heat dissipation fan is in operation, the central shaft driving surface is located inside the fan air inlet surface, and the plurality of protrusion structures are arranged at spacings in the circumferential direction of the central shaft driving surface. Some fan blades are connected between the central shaft driving surface and the fan air inlet surface. Some other fan blades are connected between each of the plurality of protrusion structures and the fan air inlet surface, such that the fan air inlet angle is formed between the fan blades and the central shaft driving surface for taking in the airflow. In some embodiments, the plurality of protrusion structures 103 are used to vary the fan air inlet angle to control the flow field of the airflow entering the fan air inlet angle. Thus, the airflow enters the fan air inlet angle more uniformly, and the air pressure and the flow rate are increased while the fan noise is reduced.

In this case, the flow field refers to a spatial distribution of airflow movements at a certain time, that is, a general term for a flow velocity and a flow direction of each airflow movement at the certain time. In some embodiments, the plurality of protrusion structures are used to vary the flow velocity and the flow direction of the airflow entering the fan air inlet angle, such that the airflow enters the fan air inlet angle more uniformly.

Figure 3:
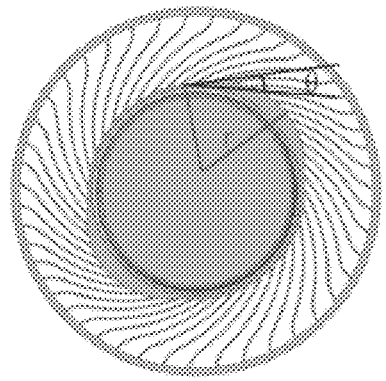
FIG. 3 is a schematic diagram of a fan air inlet angle corresponding to a protrusion structure of an exemplary heat dissipation fan according to some embodiments of the present disclosure.

FIG. 3 is a schematic diagram of a fan air inlet angle corresponding to a protrusion structure of an exemplary heat dissipation fan according to some embodiments of the present disclosure. In some embodiments, each of the plurality of protrusion structures is a crescent-shaped protrusion structure. The crescent-shaped protrusion structure is a part of a semicircular structure. The fan air inlet angle corresponding to each of the plurality of protrusion structures of the heat dissipation fan is an angle formed by a tangent line of the crescent-shaped protrusion structure and a tangent line of the central shaft driving surface, as shown in FIG. 3.

For example, an inner wall of the crescent-shaped protrusion structure is connected tangentially to the central shaft driving surface, and a connection between the crescent-shaped protrusion structure and the central shaft driving surface transitions smoothly. As a result, the fan air inlet angle corresponding to each fan blade connected to the crescent-shaped protrusion structure varies in a regular curve with a radian of a crescent periphery, thereby simultaneously changing both the airflow velocity and the airflow direction at the fan air inlet angle.

In some embodiments, the plurality of crescent-shaped protrusion structures are symmetrically arranged in a circumferential direction of the central shaft driving surface. As a result, a center of gravity of the fan remains stationary as the fan rotates, such that the fan rotates smoothly without vibration.

In one example, two crescent-shaped protrusion structures are symmetrically distributed in the circumferential direction of the central shaft driving surface. In another example, four crescent-shaped protrusion structures are symmetrically distributed in the circumferential direction of the central shaft driving surface. In another example, eight crescent-shaped protrusion structures are symmetrically distributed in the circumferential direction of the central shaft driving surface.

A radius of the crescent-shaped protrusion structure is determined according to a quantity of the plurality of crescent-shaped protrusion structures distributed in the circumferential direction of the central shaft driving surface. For example, for the same central shaft driving surface, when two crescent-shaped protrusion structures are symmetrically distributed in the circumferential direction of the central shaft driving surface, the corresponding radius of each crescent-shaped protrusion structure is R1, and when eight crescent-shaped protrusion structures are symmetrically distributed in the circumferential direction of the central shaft driving surface, the corresponding radius of each crescent-shaped protrusion structure is R2. R2 is generally smaller than R1 to achieve a smooth transition between each crescent-shaped protrusion structure and the central shaft driving surface. Those skilled in the art should be able to adaptively select the radius of each of the plurality of crescent-shaped protrusion structures based on the radius of the central shaft driving surface to achieve the smooth transition, which is not limited by the present disclosure.

In some embodiments, the radius of each of the plurality of crescent-shaped protrusion structures is about 0.5 to 0.8 times the radius of the central shaft driving surface. Thus, each of the plurality of crescent-shaped protrusion structures is just circumscribed on the central shaft driving surface. Two ends of each crescent-shaped protrusion structure transition smoothly with the central shaft driving surface. The airflow of the fan can be effectively controlled by selecting the appropriate radius of each of the plurality of crescent-shaped protrusion structures.

In some embodiments, the fan air inlet angles corresponding to the fan blades directly connected to the central shaft driving surface are identical.

For example, the fan air inlet angle corresponding to each of the fan blades that are directly connected to the central shaft driving surface is the same. The fan air inlet angle corresponding to each of the fan blades that are connected to each of the plurality of crescent-shaped protrusion structures varies regularly according to a preset curve relationship, that is, the fan air inlet angle corresponding to each of the fan blades that are connected to each of the plurality of crescent-shaped protrusion structures varies.

Figure 4:
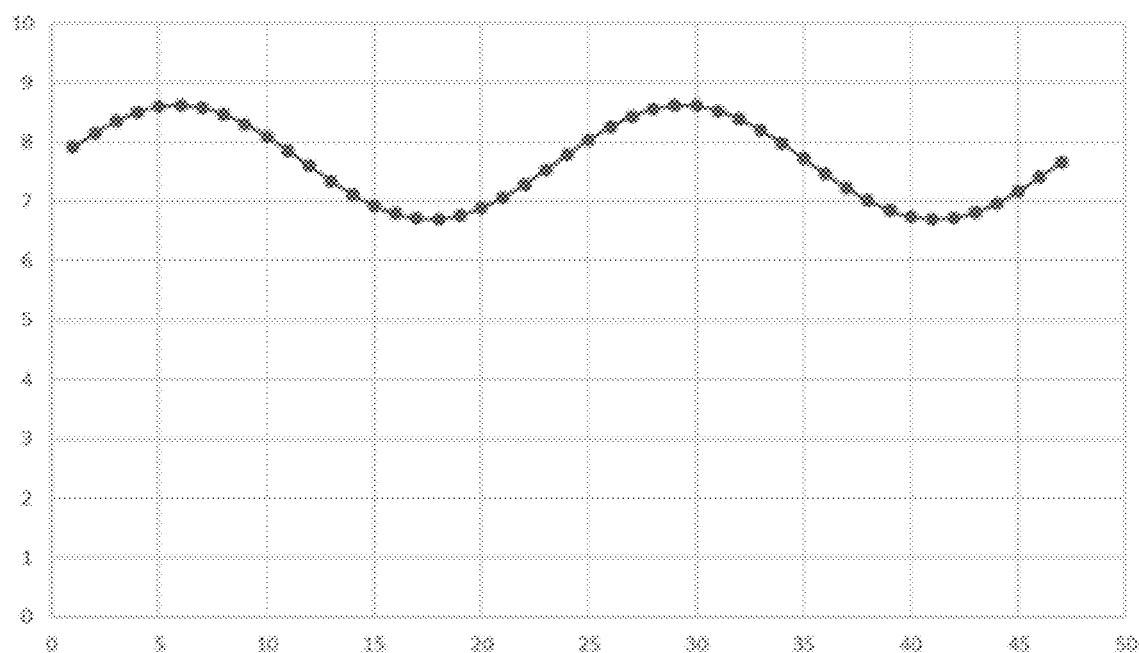
FIG. 4 is a schematic diagram showing a change curve of the fan air inlet angles of fan blades connected to the protrusion structure according to some embodiments of the present disclosure.

FIG. 4 is a schematic diagram showing a change curve of the fan air inlet angles of fan blades connected to the protrusion structure according to some embodiments of the present disclosure.

The fan air inlet angle corresponding to each of the fan blades connected to each of the plurality of crescent-shaped protrusion structures is calculated according to the following equation (1) and the equation (2).

$$\Phi = \varphi + A \sin(\theta); \quad (1)$$

$$A = \varphi/8, \theta = 2\pi n/Z \cdot k, n=2, k=1,2,3,\ldots,47; \quad (2)$$

where a reference fan air inlet angle $\varphi = 7.3°$, n is the number of the crescent-shaped protrusion structures or the number of groups of the fan blades, and k is the sequence number of the fan blades, e.g., kth fan blade. Each of the plurality of crescent-shaped protrusion structures corresponds to one group of the fan blades.

The fan air inlet angles corresponding to the fan blades that are connected to the central shaft driving surface are the same, while the fan air inlet angles corresponding to the fan blades that are connected to the crescent-shaped protrusion structure vary regularly. From an overall point of view, the fan blades are distributed at unequal spacings. Because the fan air inlet angles corresponding to the fan blades that are connected to each of the plurality of crescent-shaped protrusion structures vary regularly, the fan blades that are connected to each of the plurality of crescent-shaped protrusion structures are also distributed at unequal spacings from a local point of view. Due to the design of the unequal spacings of the fan blades, the airflow velocities entering the varying fan air inlet angles also vary. Thus, the sharpness (or the tone) of the original same frequency band sound as the fan rotates is scrambled, the howling sound is reduced, and the sound quality (or the noise performance) is improved. Moreover, the regular variation of the fan air inlet angles also varies the airflow directions entering the varying fan air inlet angles, thereby making the airflow entering the fan air inlet angles more uniform, and improving the air pressure and the flow rate of the airflow entering the fan. Thus, in the embodiments of the present disclosure, the plurality of crescent-shaped protrusion structures are provided to improve the performance of the fan while reducing the noise.

In some embodiments, the fan blades are distributed at equal spacings on one end connected to the fan air inlet surface. Specifically, for the fan blades corresponding to each of the plurality of protrusion structures, one end (or an inner end) of each fan blade is connected to each of the plurality of protrusion structures, and the other end (or an outer end) is connected to the fan air inlet surface. The inner end and the outer end of the fan blades connected to each of the plurality of protrusion structures are distributed at unequal spacings, and the inner end and the outer end of the fan blades connected to the fan air inlet surface are equally spaced. Thus, the fan air inlet angles corresponding to the fan blades connected to each of the plurality of protrusion structures vary regularly according to the preset curve relationship.

In some embodiments, the fan air inlet angles corresponding to the fan blades connected to the central shaft driving surface are the same. Moreover, the fan air inlet angle corresponding to an initial fan blade connected to each of the plurality of protrusion structures is the same as the fan air inlet angles corresponding to the fan blades connected to the central shaft driving surface. The initial fan blade connected to each of the plurality of protrusion structures is a fan blade adjacent to a fan blade connected to the central shaft driving surface. Thus, the fan air inlet angles transition smoothly from the fan blades connected to the central shaft driving surface to the fan blades connected to each of the plurality of protrusion structures.

Figure 5:
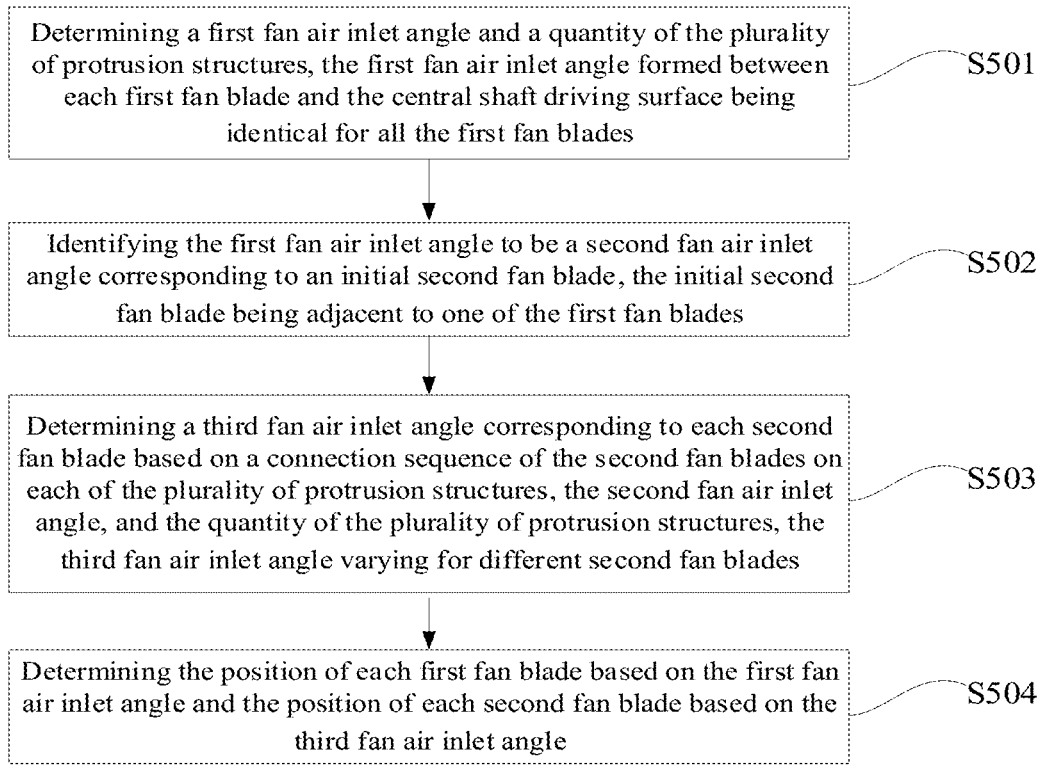
FIG. 5 is a flowchart of an exemplary method of determining a position of a fan blade in a heat dissipation fan according to some embodiments of the present disclosure.

FIG. 5 is a flowchart of an exemplary method of determining a position of a fan blade in a heat dissipation fan according to some embodiments of the present disclosure. As shown in FIG. 5, the method of determining a fan lade position in a heat dissipation fan includes the following processes.

At S501, determining a first fan air inlet angle and a quantity of the plurality of protrusion structures. The first fan air inlet angle is an angle formed between each first fan blade and the central shaft driving surface. The first fan air inlet angle is identical for all the first fan blades.

In some embodiments, each of the plurality of protrusion structures is a crescent-shaped protrusion structure.

In some embodiments, the plurality of protrusion structures are symmetrically arranged in a circumference direction of the central shaft driving surface. For example, when the quantity of the plurality of protrusion structures is 2, two protrusion structures are arranged opposite to each other on the central shaft driving surface. In another example, when the quantity of the plurality of protrusion structures is 3, three protrusion structures are arranged on the central shaft driving surface to form an equal lateral triangle.

In some embodiments, a radius of the crescent-shaped protrusion structure is about 0.5 to 0.8 times a radius of the central shaft driving surface.

At S502, identifying the first fan air inlet angle to be a second fan air inlet angle corresponding to an initial second fan blade.

In some embodiments, the initial second fan blade is a second fan blade adjacent to one of the first fan blades. Identifying the first fan air inlet angle to be the second fan air inlet angle corresponding to the initial second fan blade allows a smooth transition between the first fan blades and the second fan blades.

At S503, determining a third fan air inlet angle corresponding to each second fan blade based on a connection sequence of the second fan blades on each of the plurality of protrusion structures, the second fan air inlet angle, and the quantity of the plurality of protrusion structures.

In some embodiments, the third fan air inlet angle varies for different second fan blades. The plurality of protrusion structures are configured to vary the third fan air inlet angle to control a flow field of an airflow entering the third fan air inlet angle.

At S504, determining the position of each first fan blade based on the first fan air inlet angle and the position of each second fan blade based on the third fan air inlet angle.

In some embodiments, the first fan air inlet angle corresponding to all the first fan blades is identical. As such, all the first fan blades are arranged identically between the central shaft driving surface and the fan air inlet surface.

In some embodiments, the third fan air inlet angle varies for different second fan blades. Based on equation (1) and equation (2), the third fan air inlet angle corresponding to each second fan blade can be determined. Then, connection positions of an inner end and an outer end of each second fan blade can be determined. Because the third fan air inlet angle corresponding to different second fan blades varies regularly, the variation of the third fan air inlet angle not only changes the flow rate of the airflow entering the third fan air inlet angle, but also changes the flow direction of the airflow entering the third fan air inlet angle. As a result, the airflow enters the third fan air inlet angle more smoothly, and the air pressure and the flow rate of the airflow entering the third fan are improved. Thus, the plurality of protrusion structures provided by the embodiments of the present disclosure improve the fan performance while reducing the fan noise.

In some embodiments, determining the position of each second fan blade based on the third fan air inlet angle includes: determining a first connection position between an outer end of each second fan blade and the fan air inlet surface based on an equal spacing rule; and determining a second connection position between an inner end of the second fan blade and each corresponding protrusion structure based on the third fan air inlet angle corresponding to the second fan blade. Thus, by designing the second fan blades to be distributed at unequal spacings, the flow velocity of the airflow entering the third fan air inlet angle varies, such that the sharpness (or the tone) of the original same frequency band sound generated as the fan rotates is scrambled, the howling sound is reduced, and the sound quality (or the noise performance) is improved.

Figure 6:
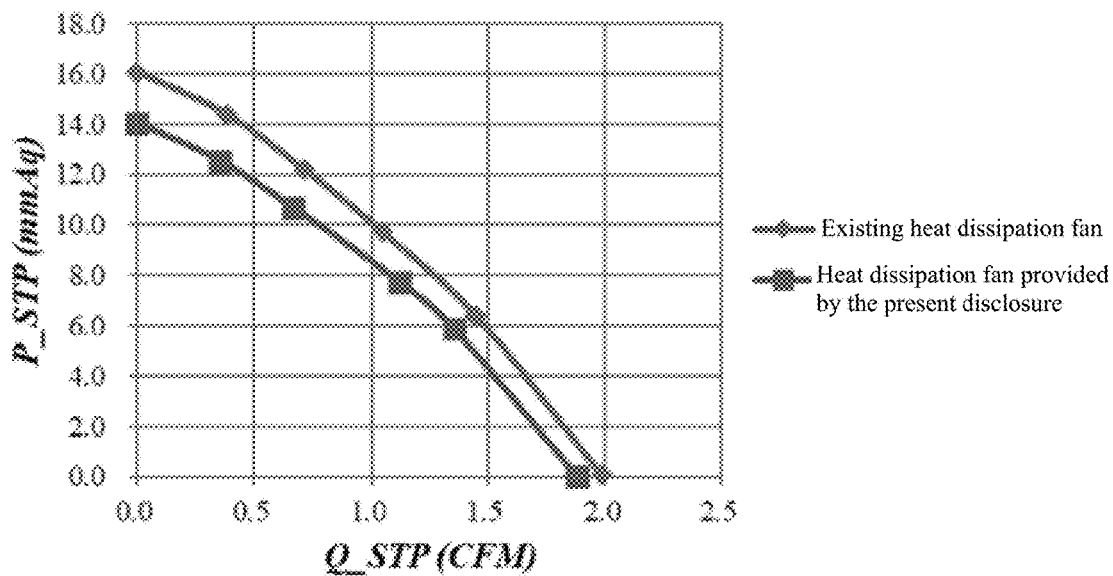
FIG. 6 is a schematic diagram showing air pressure vs flow rate curves for an existing heat dissipation fan and an exemplary heat dissipation fan according to some embodiments of the present disclosure.

FIG. 6 is a schematic diagram showing air pressure vs flow rate curves for an existing heat dissipation fan and an exemplary heat dissipation fan according to some embodiments of the present disclosure.

As shown in FIG. 6, under a condition of same sound loudness, compared with the existing heat dissipation fan, the flow rate of the heat dissipation fan provided by the embodiments of the present disclosure is increased by about 5.1%, and similarly the air pressure is increased by about 13.4%.

Figure 7:
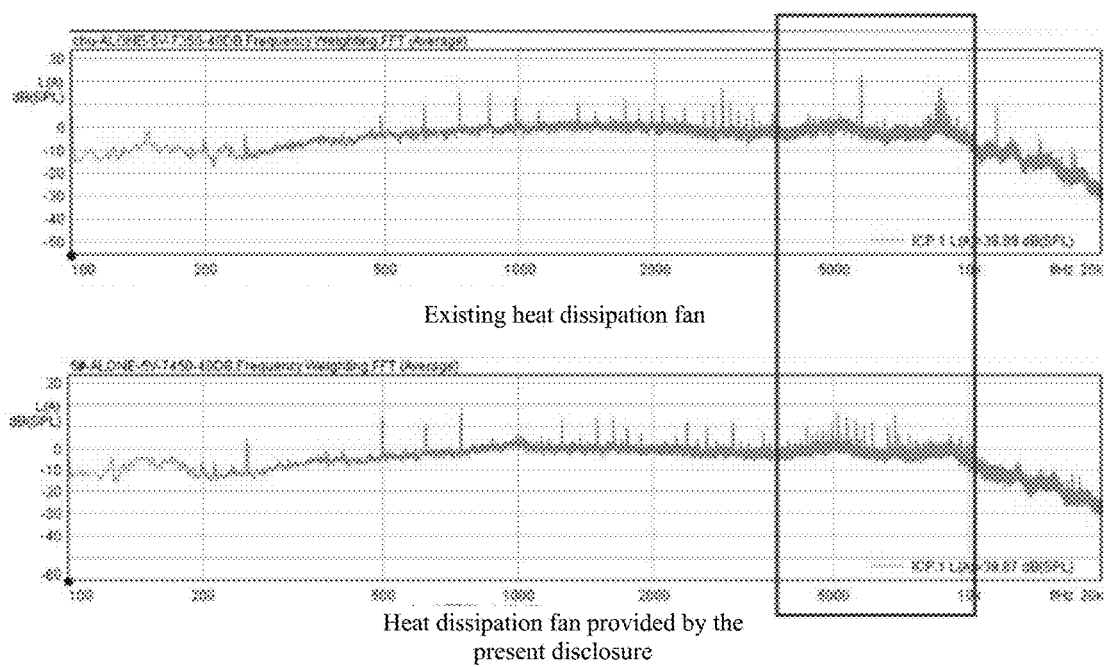
FIG. 7 is a schematic diagram showing respective FFT peak curves corresponding to an existing heat dissipation fan and an exemplary heat dissipation fan according to some embodiments of the present disclosure.

FIG. 7 is a schematic diagram showing respective FFT peak curves corresponding to an existing heat dissipation fan and an exemplary heat dissipation fan according to some embodiments of the present disclosure.

As shown in FIG. 7, under the condition of the same sound loudness, an FFT peak of the existing heat dissipation fan is about 21 dB while the FFT peak of the heat dissipation fan provided by the embodiments of the present disclosure is about 15 dB, which is reduced by about 6 dB.

The present disclosure also provides a device for determining a position of the a fan blade in a heat dissipation fan. The device includes an acquisition module, a first determination module, a second determination module, and a third determination module. The acquisition module is configured to obtain a fan air inlet angle corresponding to the fan blade connected to a central shaft driving surface, and the number of crescent-shaped protrusion structures. The first determination module is configured to determine the fan air inlet angle corresponding to the fan blade connected to the central shaft driving surface to be the fan air inlet angle corresponding to an initial fan blade connected to each crescent-shaped protrusion structure. The second determination module is configured to determine a fan air inlet angle corresponding to any one of the fan blades other than the initial fan blade and connected to each crescent-shaped protrusion structure based on a connection sequence of the fan blades in each crescent-shaped protrusion structure, the fan air inlet angle corresponding to the initial fan blade connected to each crescent-shaped protrusion structure, and the number of the crescent-shaped protrusion structures. The third determination module is configured to determine a connection position of any one of the fan blades connected to each crescent-shaped protrusion structure between each crescent-shaped protrusion structure and a fan air inlet surface based on the fan air inlet angle corresponding to the one of the fan blades.

In some embodiments, the third determination module includes a first determination unit configured to determine a connection position between one end of the fan blade and the fan air inlet surface based on an unequal spacing rule, and a second determination unit configured to determine another connection position between the other end of the fan blade and the corresponding crescent-shaped protrusion structure based on the fan air inlet angle corresponding to the fan blade.

The device may be used to perform the method of determining positions of the fan blades in the heat dissipation fan provided by the embodiments of the present disclosure, and may include a functional module and beneficial effects for performing the method of determining the position of the fan blades in the heat dissipation fan. For technical details not described in detail in this embodiment, reference can be made to the method of determining the position of the fan blades in the heat dissipation fan provided by the embodiments of the present disclosure.

It should be understood that reference throughout the specification to "one embodiment" or "an embodiment" means that a particular feature, structure, or characteristic related to the embodiment is included in at least one embodiment of the present disclosure. Thus, appearances of "in one embodiment" or "in an embodiment" in various places throughout the specification are not necessarily referring to the same embodiment. Furthermore, the particular features, structures or characteristics may be combined in any suitable manner in one or more embodiments. It should be understood that, in various embodiments of the present disclosure, the sequence numbers of the above-described processes do not refer to an execution order. The execution order of the processes should be determined by their functions and internal logic, and should not be used to limit the embodiments of the present disclosure. The sequence numbers in the embodiments of the present disclosure are intended for description only, and do not represent the advantages and disadvantages of the embodiments.

In some embodiments, unless otherwise defined, the technical terms or scientific terms used in the description of the embodiments of the present disclosure should have the usual meanings understood by those skilled in the art to which the embodiments of the present disclosure belong. "first\second" and similar words used in the embodiments of the present disclosure do not indicate any order, quantity or importance, but are only used to distinguish similar components.

It should be noted that, in the specification, the terms "comprising", "including" or any other variation thereof are intended to cover a non-exclusive inclusion such that a process, method or apparatus comprising a series of elements includes not only those elements, but also other elements not expressly listed or elements inherent in such process, method, or apparatus. Without further limitations, an element defined by the phrase "comprising a . . . " does not preclude the presence of additional identical elements in the process, method, article, or apparatus comprising that element. In the embodiments of the present disclosure, it should be understood that the disclosed devices and methods may be implemented in other ways. The device embodiments described above are only illustrative. For example, division of units is only a logical function division. In actual implementation, there may be other division methods. For example, multiple units or components may be combined or may be integrated into another system. Some features may be ignored or may not be implemented.

The above is only the embodiment of the present application, but the scope of protection of the present application is not limited thereto. The above description of the disclosed embodiments enables those skilled in the art to implement or use the present disclosure. Various modifications to the embodiments will be obvious to those skilled in the art, and the general principles defined herein can be implemented in other embodiments without departing from the spirit or scope of the present disclosure. Therefore, the disclosure will not be limited to the embodiments shown in the specification, but should conform to the broadest scope consistent with the principles and novelties disclosed in the specification. The protection scope of the present application should be determined by the protection scope of the claims.

What is claimed is:

1. A heat dissipation fan, comprising:
a body including a fan air inlet surface, a central shaft driving surface located inside the fan air inlet surface, and a plurality of protrusion structures configured at spacings in a circumference direction of the central shaft driving surface; and
fan blades including first fan blades connected between the central shaft driving surface and the fan air inlet surface, and second fan blades connected between the protrusion structure and the fan air inlet surface;
wherein a fan air inlet angle is formed between each fan blade and the central shaft driving surface, and the plurality of protrusion structures are configured to vary the fan air inlet angle to control a flow field of an airflow entering the fan air inlet angle.

2. The heat dissipation fan according to claim 1, wherein: each of the plurality of protrusion structures is a crescent-shaped protrusion structure.

3. The heat dissipation fan according to claim 2, wherein: the plurality of protrusion structures are symmetrically arranged in the circumference direction of the central shaft driving surface.

4. The heat dissipation fan according to claim 3, wherein: a radius of the crescent-shaped protrusion structure is about 0.5 to 0.8 times a radius of the central shaft driving surface.

5. The heat dissipation fan according to claim 1, wherein: respective fan air inlet angles corresponding to the first fan blades are identical.

6. The heat dissipation fan according to claim 1, wherein: respective fan air inlet angles corresponding to the second fan blades vary regularly according to a preset curve relationship.

7. The heat dissipation fan according to claim 1, wherein: outer ends of the fan blades are distributed at equal spacings to connect to the fan air inlet surface.

8. The heat dissipation fan according to claim 1, wherein: the fan air inlet angle corresponding to an initial second fan blade is identical to the fan air inlet angle corresponding to any one of the first fan blades, the initial second fan blade being adjacent to one of the first fan blades.

9. A method of determining a position of a fan blade in a heat dissipation fan, the heat dissipation fan including a body including a fan air inlet surface, a central shaft driving surface located inside the fan air inlet surface, and a plurality of protrusion structures configured at spacings in a circumference direction of the central shaft driving surface, and fan blades including first fan blades connected between the central shaft driving surface and the fan air inlet surface, and second fan blades connected between the protrusion structure and the fan air inlet surface, and the method comprising:
determining a first fan air inlet angle and a quantity of the plurality of protrusion structures, the first fan air inlet angle formed between each first fan blade and the central shaft driving surface being identical for all the first fan blades;
identifying the first fan air inlet angle to be a second fan air inlet angle corresponding to an initial second fan blade, the initial second fan blade being adjacent to one of the first fan blades;
determining a third fan air inlet angle corresponding to each second fan blade based on a connection sequence of the second fan blades on each of the plurality of protrusion structures, the second fan air inlet angle, and the quantity of the plurality of protrusion structures, the third fan air inlet angle varying for different second fan blades; and
determining the position of each first fan blade based on the first fan air inlet angle and the position of each second fan blade based on the third fan air inlet angle.

10. The method according to claim 9, wherein: determining the position of each second fan blade based on the third fan air inlet angle includes:
determining a first connection position between an outer end of each second fan blade and the fan air inlet surface based on an equal spacing rule; and
determining a second connection position between an inner end of the second fan blade and each corresponding protrusion structure based on the third fan air inlet angle corresponding to the second fan blade.

* * * * *